(12) United States Patent
Joo et al.

(10) Patent No.: US 6,784,031 B2
(45) Date of Patent: Aug. 31, 2004

(54) METHOD FOR FORMING THIN FILMS OF SEMICONDUCTOR DEVICES

(75) Inventors: Sung Jae Joo, Kyoungki-do (KR); Seok Kiu Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/324,720

(22) Filed: Dec. 19, 2002

(65) Prior Publication Data

US 2003/0124760 A1 Jul. 3, 2003

(30) Foreign Application Priority Data

Dec. 31, 2001 (KR) .................................... 2001-0089149

(51) Int. Cl.$^7$ ............................................ H01L 21/00
(52) U.S. Cl. ....................................... 438/149; 438/584
(58) Field of Search ................................ 438/149, 584

(56) References Cited

FOREIGN PATENT DOCUMENTS

| KR | 1995-0024256 | 8/1995 |
| KR | 1996-0039133 | 11/1996 |

OTHER PUBLICATIONS

Korean Intellectual Property Office Notice of Rejection dated Dec. 12, 2003 (4 pages).

*Primary Examiner*—Long Pham
(74) *Attorney, Agent, or Firm*—Marshall, Gerstein & Borun LLP

(57) ABSTRACT

Methods for forming thin films of semiconductor devices, and more specifically, methods for forming thin films of semiconductor devices, wherein the semiconductor substrate is subjected to a thin film formation process in a thin film formation apparatus containing a chamber, a susceptor vertically movable in the chamber and a heater disposed within the susceptor, the method comprising a preheating process for stabilizing the internal temperature of the chamber by vertically moving the susceptor a predetermined number of times prior to the thin film formation process.

14 Claims, 2 Drawing Sheets

METHOD FOR FORMING THIN FILMS OF SEMICONDUCTOR DEVICES

BACKGROUND

1. Technical Field

Methods for forming thin films of semiconductor devices are disclosed, and more specifically, methods for forming thin films of semiconductor devices are disclosed which solve the problems associated with growth rate variations during the process of forming the films. An apparatus is disclosed for the film forming process which comprises a metal dome and a vertically movable susceptor having a resistor type heater disposed in a chamber.

2. Description of the Related Art

Generally, thin films formed on semiconductor substrates are formed by performing deposition process in a chamber.

FIG. 1 is a cross-sectional diagram illustrating a chemical vapor deposition apparatus in which processes are performed one wafer at a time.

Referring to FIG. 1, a reactor comprises a metal dome 11 and a chamber 13. A heater 17 for heating a semiconductor substrate 27 is mounted in a susceptor 15 composed of graphite.

The susceptor 15 moves vertically. When the semiconductor substrate 27 is inserted in the chamber, the susceptor 15 is lowered to a predetermined position, and the substrate 27 is moved through a chamber entryway 19 and placed on the susceptor 15 by a robot arm. Thereafter, the susceptor 15 is lifted to a predetermined position, and source gas is injected through a gas outlet 21 into the chamber whereby, chemical vapor deposition reaction is started to grow a thin film on the semiconductor substrate.

After the growth process of the thin film is completed, the susceptor 15 is lowered again, and the substrate 27 having a thin film thereon is moved through the chamber entryway 21 out of the chamber by the robot arm and then a new semiconductor substrate is placed on the susceptor 15, and the first cycle of process is completed.

However, the thin films grown on the substrate do not have the same thickness although the same process is performed to grow thin film on different semiconductor substrates.

FIG. 2 is a graph illustrating the thickness of polysilicon film formed on wafers processed according to insertion sequence using the apparatus shown FIG. 1. FIG. 2 shows that a desired thickness is obtained from the 9th wafer.

Eight wafers previous to the 9th wafer are used as dummy substrates, which is very inefficient.

Although the growth process is performed under the same conditions, each thin film has different thickness due to difference between the actual process environment and the process conditions set by apparatus operator.

The growth speed of polysilicon is sensitive to temperature. The actual surface temperature of the substrate differs from the set temperature because the susceptor 15 moves vertically as shown in FIG. 1 and the distance between the dome 11 and the substrate 27 is not constant.

The dome 11 which is composed of metal has considerable reflectivity in a wavelength range including wavelength of infrared rays and the semiconductor substrate 27 also has considerable reflectivity, respectively.

The surface temperature of the substrate 27 is affected by heat reflected from the dome 11 as well as heat conducted from the resistor type heater 17.

The heat reflected from the dome 11 becomes weaker as the distance between the dome 11 and the substrate 27 becomes greater.

Here, the susceptor stays stopped in idle state before the thin film growth process starts. However, when the process starts, the susceptor 15 begins to move up and down repeatedly and the surface temperature of the substrate 11 drops.

The temperature drop of substrate is sensed by temperature sensors such as thermocouple (not shown), and the heater 17 is further heated to maintain the desired temperature of substrate. However, the temperature stabilization requires much time because the resistor type heater 17 does not immediately react to increase in power applied to the heater 17.

As a result, when the thin film growth process starts, each of initially inserted wafers has thin films having different thickness formed thereon because the process is not performed at the desired set temperature.

As described above, because thin films formed on semiconductor substrates initially inserted one at a time in the apparatus does not have desired thickness, the conventional method for forming thin films of semiconductors reduces the productivity of semiconductor devices, thereby degrading yield thereof.

SUMMARY OF THE DISCLOSURE

Accordingly, a method is disclosed for forming thin films of semiconductor devices, comprising performing a preheating process before the main process to stabilize the surface temperature of susceptor so that the temperature drop due to vertical movement of the susceptor is compensated.

A method for forming a thin film on a semiconductor substrate is disclosed, wherein the semiconductor substrate is subjected to a thin film formation process in a thin film formation apparatus containing a chamber, a susceptor vertically movable in the chamber and a heater disposed within the susceptor, the method comprising a preheating process for stabilizing the internal temperature of the chamber by vertically moving the susceptor a predetermined number of times prior to the thin film formation process.

It is preferable that a wall and ceiling of the chamber comprises metal, and the preheating process is performed under inert gas atmosphere with a dummy substrate mounted on the susceptor. The preheating process is performed using a source gas selected from the group consisting of $SiH_4$, $Si_2H_6$, $Si_2H_2Cl_2$, $GeH_4$, $Ge_2H_6$, $Ge_2H_2Cl_2$ and combinations thereof.

It is preferable that the number of vertical movements of the susceptor is determined by the factors comprising a stop position, a time period at the stop position of the susceptor and combinations thereof so that internal temperature of the chamber is stabilized. The susceptor moves vertically 1 to 30 times during the preheating process. The temperature of semiconductor substrate is stabilized at a temperature ranging from 600 to 800° C. after the preheating process.

A method for forming a thin film on a semiconductor substrate is disclosed, wherein the semiconductor substrate is subjected to a thin film formation process in a thin film formation apparatus containing a chamber, a susceptor vertically movable in the chamber and a heater disposed within the susceptor, the method comprising performing a preheating process, prior to a thin film formation process, for stabilizing the internal temperature of the chamber by setting the temperature of the heater higher than the temperature required for the thin film formation process for a predetermined time period sufficient to compensate for a temperature drop due to vertical movement of the susceptor in the thin film formation process.

It is preferable that the temperature of the heater during the preheating, process is set 100 to 200° C. higher than a temperature required during the thin film formation process.

The preheating process is performed under inert gas atmosphere with a dummy substrate mounted on the susceptor. The preheating process is performed using a source gas selected from the group consisting of $SiH_4$, $Si_2H_6$, $Si_2H_2Cl_2$, $GeH_4$, $Ge_2H_6$, $Ge_2H_2Cl_2$ and combinations thereof.

Generally, the heater is used at a temperature ranging from 700 to 1000° C.

A method for forming a thin film on a semiconductor substrate is disclosed, wherein the semiconductor substrate is subjected to a thin film formation process in a CVD chamber, the method further comprising a preheating process for stabilizing the internal temperature of the chamber by vertically moving the susceptor a predetermined number of times prior to a thin film formation process.

A preheating process comprising vertical movement of susceptor is performed before the thin film formation process to have the surface temperature of susceptor to approach the surface temperature required during the actual process. This prevents the thin films formed on the semiconductor substrate from having difference in thickness and property when the formation process is performed at unstable temperatures in a CVD apparatus having a vertically moving susceptor, a resistor type heater and a metal dome.

DETAILED DESCRIPTION OF THE PRESENTLY PREFERRED EMBODIMENTS

Figure 1:
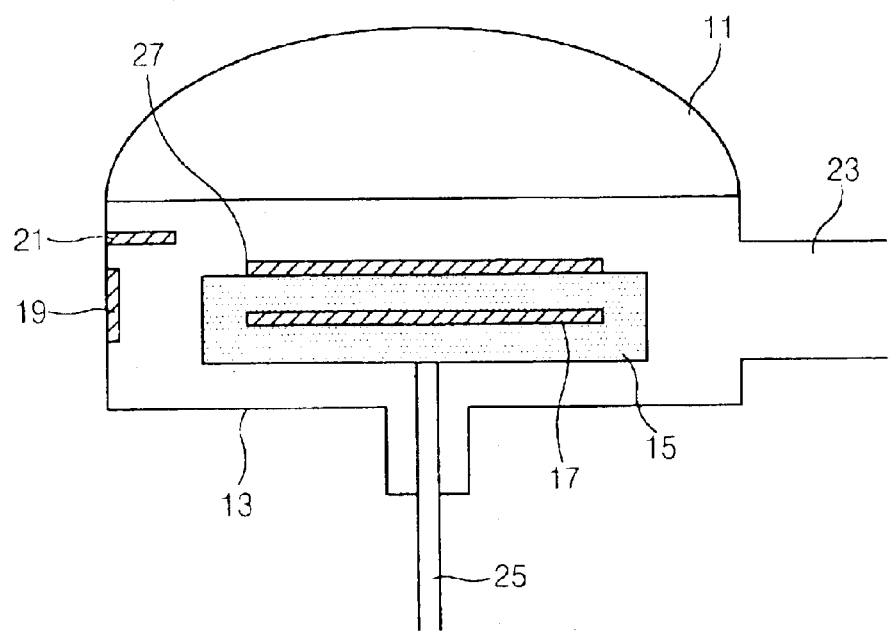
FIG. 1 is a cross-sectional diagram illustrating a chemical vapor deposition apparatus.

The disclosed method for forming thin films of semiconductor devices will be described in detail referring to the accompanied drawings.

Although not shown in the drawings, an example in which a disclosed method is applied to a process wherein the following three steps are performed on each wafer is described.

Step 1: a semiconductor substrate is placed on a susceptor in a chamber and stays at the position for 3 minutes.

Step 2: when the susceptor is elevated to a certain position, and a predetermined process is performed for 4 minutes.

Step 3: the susceptor is lowered, and the semiconductor substrate is taken out of the chamber after one minute.

First, the above three steps are repeated predetermined times before the first substrate is inserted into the chamber to stabilize the temperature.

Thereafter, the entire subsequent process is performed at a stabilized temperature.

Here, it should be noted that the susceptor move vertically and the time period the susceptor stays at certain positions be the same as or close that of the actual process to stabilize the temperature.

Additionally, the time required to stabilize the temperature can be reduced by adjusting other variables in each step. For example, the vertical movement of the susceptor may be performed in vacuum or with argon gas injected into the chamber in each of the three steps.

The above process may be performed without the semiconductor substrate or with a dummy substrate on the susceptor.

The purpose of using the dummy substrate is to keep the process condition as close to that of the actual process as possible, by taking temperature variation due to reflectivity of the semiconductor substrate as well as the metal dome into consideration.

In the step 2, processes such as deposition, sputtering, etching and annealing same as the actual process may be performed, or a purge process may be performed by flowing inert gas such as argon into the chamber.

Figure 3:
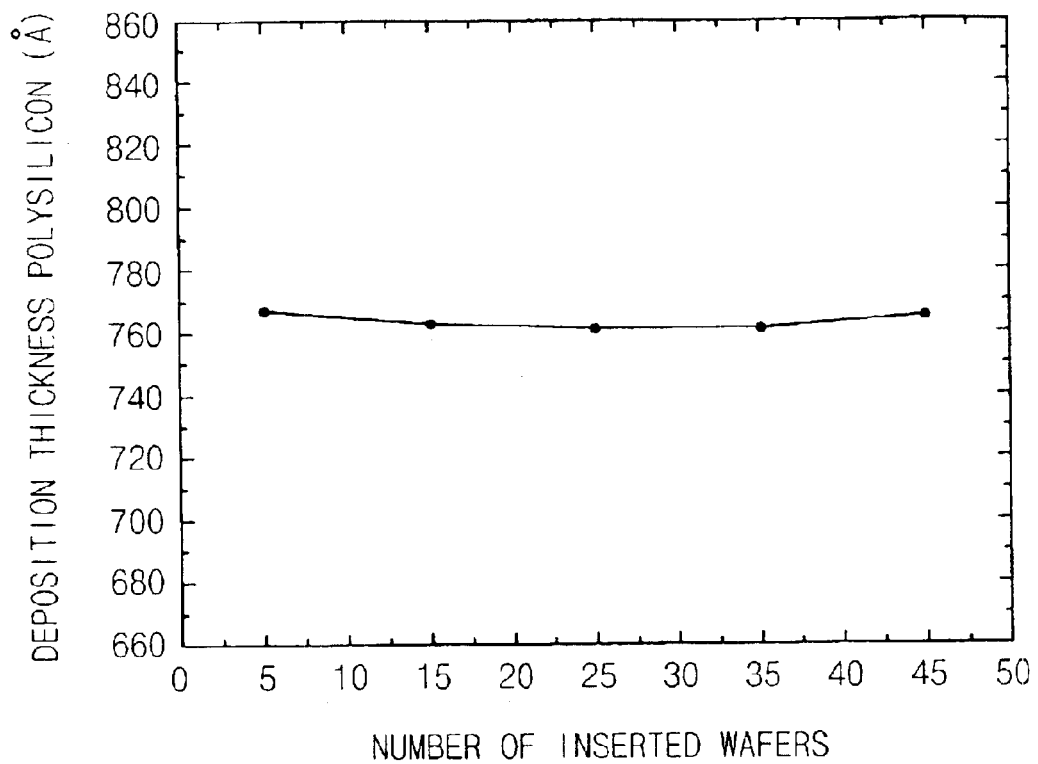
FIG. 3 is a graph illustrating a thickness of polysilicon film formed using the apparatus of FIG. 1 in accordance with this disclosure

FIG. 3 is a graph illustrating the thickness of polysilicon film after performing the preheating process comprising the above three steps five times with a dummy substrate and a small amount of argon gas injected into a chamber in a chemical vapor deposition apparatus similar to the apparatus shown in FIG. 1.

Figure 2:
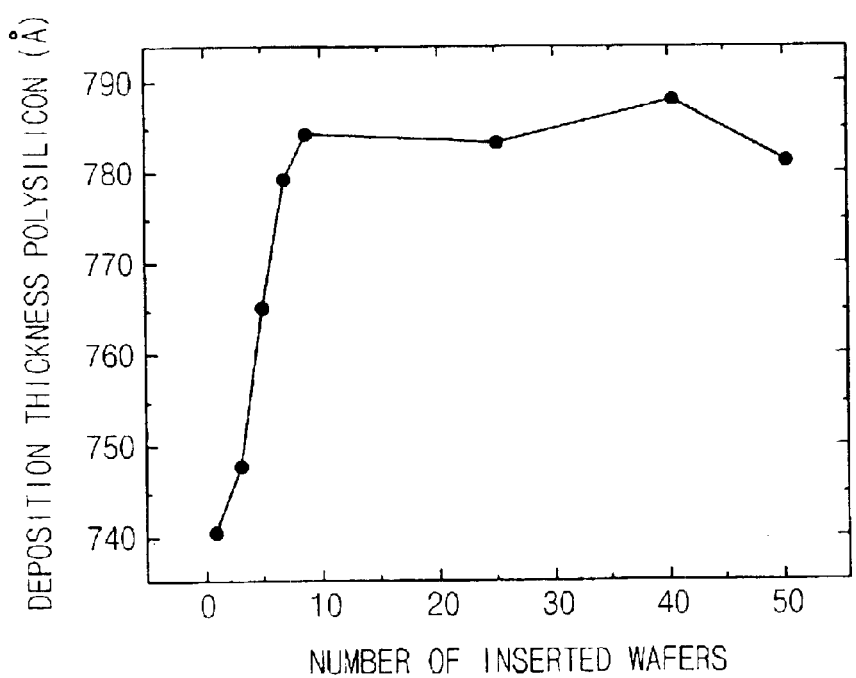
FIG. 2 is a graph illustrating a thickness of polysilicon film formed using the apparatus of FIG. 1 in accordance with the conventional art.

As shown in FIG. 3, the growth speed and thickness of polysilicon films on the initially inserted semiconductor substrates does not vary as shown in FIG. 2.

Another preferred embodiment is described as follows.

The preheating process may comprise more or less than the three steps depending on the actual process. The time required to stabilize the temperature may be reduced or extended by controlling variables such as position of susceptor, the time period the susceptor stays at certain position, kind and amount of gas injected into a chamber in each step.

In addition, instead of vertically moving the susceptor in the preheating process, the temperature of the heater may be intentionally set higher for the initially inserted substrates, for example, 100 to 200° C. higher than the predetermined temperature of the main process to compensate for the temperature drop due to vertical movements of the susceptor. In this case, the optimum temperature of the heater should be obtained previous to the actual process through the previous experiment. It is preferable that the preheating process is performed under inert gas atmosphere with a dummy substrate mounted on the susceptor.

A structure for circulating refrigerants may be provided within an internal wall and a ceiling of the chamber. The susceptor is preferably formed of metal or graphite.

The preheating process may be performed using a gas selected from the group consisting of $SiH_4$, $Si_2H_6$, $Si_2H_2Cl_2$, $GeH_4$, $Ge_2H_6$, $Ge_2H_2Cl_2$ and combinations thereof as source gas.

After the preheating process, the semiconductor substrate is stabilized at a temperature ranging from 600 to 800° C.

As discussed earlier, the disclosed methods for forming thin films of semiconductor devices provide improved yields and productivity of semiconductor devices by enabling thin films formed on semiconductor substrates to be grown to a predetermined thickness through the temperature stabilization in the deposition chamber.

What is claimed is:

1. A method for forming a thin film on a semiconductor substrate in a thin film formation apparatus containing a chamber, a susceptor vertically movable in the chamber and the susceptor comprising a heater, the method comprising:

a preheating process for stabilizing the internal temperature of the chamber by vertically moving the susceptor and heater within the chamber a predetermined number of times while the heater is generating heat prior to the thin film formation process thereby reducing temperature gradients within the chamber.

2. The method according to claim 1, wherein an internal wall and a ceiling of the chamber is substantially consisting of metal.

3. The method according to claim 1, wherein the preheating process is performed with a dummy substrate mounted on the susceptor.

4. The method according to claim 1, wherein the preheating process is performed under inert gas atmosphere.

5. The method according to claim 3, wherein the dummy substrate is subject to a CVD process during the preheating process using a source gas selected from the group consisting of $SiH_4$, $Si_2H_6$, $Si_2H_2Cl_2$, $GeH_4$, $Ge_2H_6$, $Ge_2H_2Cl_2$ and combinations thereof.

6. The method according to claim 1, wherein the number of vertical movements of the susceptor is determined by the factors comprising a stop position, a time period at the stop position of the susceptor and combinations thereof so that internal temperature of the chamber is stabilized.

7. The method according to claim 1, wherein the susceptor moves vertically 1 to 30 times during the preheating process.

8. The method according to claim 1, wherein the temperature of semiconductor substrate is stabilized at 600 to 800° C. after the preheating process.

9. A method for forming a thin film on a semiconductor substrate in a thin film formation apparatus containing a chamber, a susceptor vertically movable in the chamber and a heater disposed within the susceptor, the method comprising:

performing a preheating process, prior to a thin film formation process, for stabilizing the internal temperature of the chamber by setting the temperature of the heater higher than the temperature required for the thin film formation process for a predetermined time period sufficient to compensate for a temperature drop due to vertical movement of the susceptor in the thin film formation process.

10. The method according to claim 9, wherein the temperature of the heater during the preheating process is set 100 to 200° C. higher than a temperature required during the thin film formation process.

11. The method according to claim 9, wherein the preheating process is performed with a dummy substrate mounted on the susceptor.

12. The method according to claim 9, wherein the preheating process is performed under inert gas atmosphere.

13. The method according to claim 11, wherein the dummy substrate is subject to a CVD process during the preheating process using a source gas selected from the group consisting of $SiH_4$, $Si_2H_6$, $Si_2H_2Cl_2$, $GeH_4$, $Ge_2H_6$, $Ge_2H_2Cl_2$ and combinations thereof as source gas.

14. A method for forming a thin film on a semiconductor substrate in a CVD chamber, the method further comprising:

a preheating process for stabilizing the internal temperature of the chamber by vertically moving the susceptor that comprises a heater a predetermined number of times prior to a thin film formation process while the heater is generating heat thereby reducing temperature gradients within the chamber.

* * * * *